United States Patent
Cobley et al.

(10) Patent No.: US 9,681,539 B2
(45) Date of Patent: Jun. 13, 2017

(54) SYSTEM AND APPARATUS FOR PLANT MONITORING AND CONTROL

(71) Applicants: Richard A. Cobley, Scranton, PA (US); Joseph G. Murray, Mission Viejo, CA (US)

(72) Inventors: Richard A. Cobley, Scranton, PA (US); Joseph G. Murray, Mission Viejo, CA (US)

(73) Assignees: Lockheed Martin Corporation, Bethesda, MD (US); State Nuclear Power Automation System Engineering Company (CN)

(*) Notice: Subject to any disclaimer, the term of this patent is extended or adjusted under 35 U.S.C. 154(b) by 312 days.

(21) Appl. No.: 14/617,365

(22) Filed: Feb. 9, 2015

(65) Prior Publication Data

US 2015/0173182 A1 Jun. 18, 2015

Related U.S. Application Data

(63) Continuation of application No. 13/165,347, filed on Jun. 21, 2011, now abandoned.

(60) Provisional application No. 61/357,792, filed on Jun. 23, 2010, provisional application No. 61/357,066, filed on Jun. 21, 2010.

(51) Int. Cl.
| | |
|---|---|
| *H05K 5/00* | (2006.01) |
| *H05K 1/02* | (2006.01) |
| *G21D 3/00* | (2006.01) |
| *H05K 1/14* | (2006.01) |

(52) U.S. Cl.
CPC .............. *H05K 1/0293* (2013.01); *G21D 3/00* (2013.01); *H05K 1/141* (2013.01); *G05B 2219/21109* (2013.01); *H05K 2201/04* (2013.01); *Y02E 30/39* (2013.01)

(58) Field of Classification Search
CPC .......... H05K 1/18; H05K 1/113; H05K 1/141; H05K 3/4007; G06F 3/00; G06F 11/1004; G06F 11/1608
USPC ............ 361/730, 748, 756, 796, 802; 710/2; 714/30; 376/210, 215, 216
See application file for complete search history.

(56) References Cited

U.S. PATENT DOCUMENTS

| | | | |
|---|---|---|---|
| 5,642,264 A * | 6/1997 | Cantrell | H05K 7/1425 361/756 |
| 6,553,090 B2 * | 4/2003 | Fukasawa | G21C 17/00 376/210 |

(Continued)

OTHER PUBLICATIONS

Author Unknown, "Criteria for Use of Computers in Safety Systems of Nuclear Power Plants," Regulatory Guide 1.152, Revision 3, Jul. 2011, U.S. Nuclear Regulatory Commision, 13 pages.

(Continued)

*Primary Examiner* — Xiaoliang Chen
(74) *Attorney, Agent, or Firm* — Withrow & Terranova, PLLC

(57) ABSTRACT

A system and apparatus for monitoring and control of the operation of various types of industrial plants, including power plants, nuclear power plants and plants including various types of mechanical, electrical and chemical machinery. The invention employs modular non-microprocessor based, non-software based digital hardware that enables communication between sensors and control logic and between the control logic and actuators that control a functional aspect of each plant.

20 Claims, 10 Drawing Sheets

(56) References Cited

U.S. PATENT DOCUMENTS

| | | | | |
|---|---|---|---|---|
| 7,305,317 | B2 * | 12/2007 | Yuan | G05B 23/0235 |
| | | | | 702/116 |
| 7,870,299 | B1 * | 1/2011 | Sorensen | G06F 11/1004 |
| | | | | 710/2 |
| 2008/0043448 | A1 * | 2/2008 | Finnerty | G06F 1/20 |
| | | | | 361/748 |

OTHER PUBLICATIONS

Author Unknown, "IEEE Standard Criteria for Digital Computers in Safety Systems of Nuclear Power Generating Stations," Standard 7-4.3.2-2003, IEEE, 56 pages.

Non-Final Office Action for U.S. Appl. No. 13/165,347, mailed Apr. 2, 2014, 7 pages.

Final Office Action for U.S. Appl. No. 13/165,347, mailed Sep. 8, 2014, 6 pages.

* cited by examiner

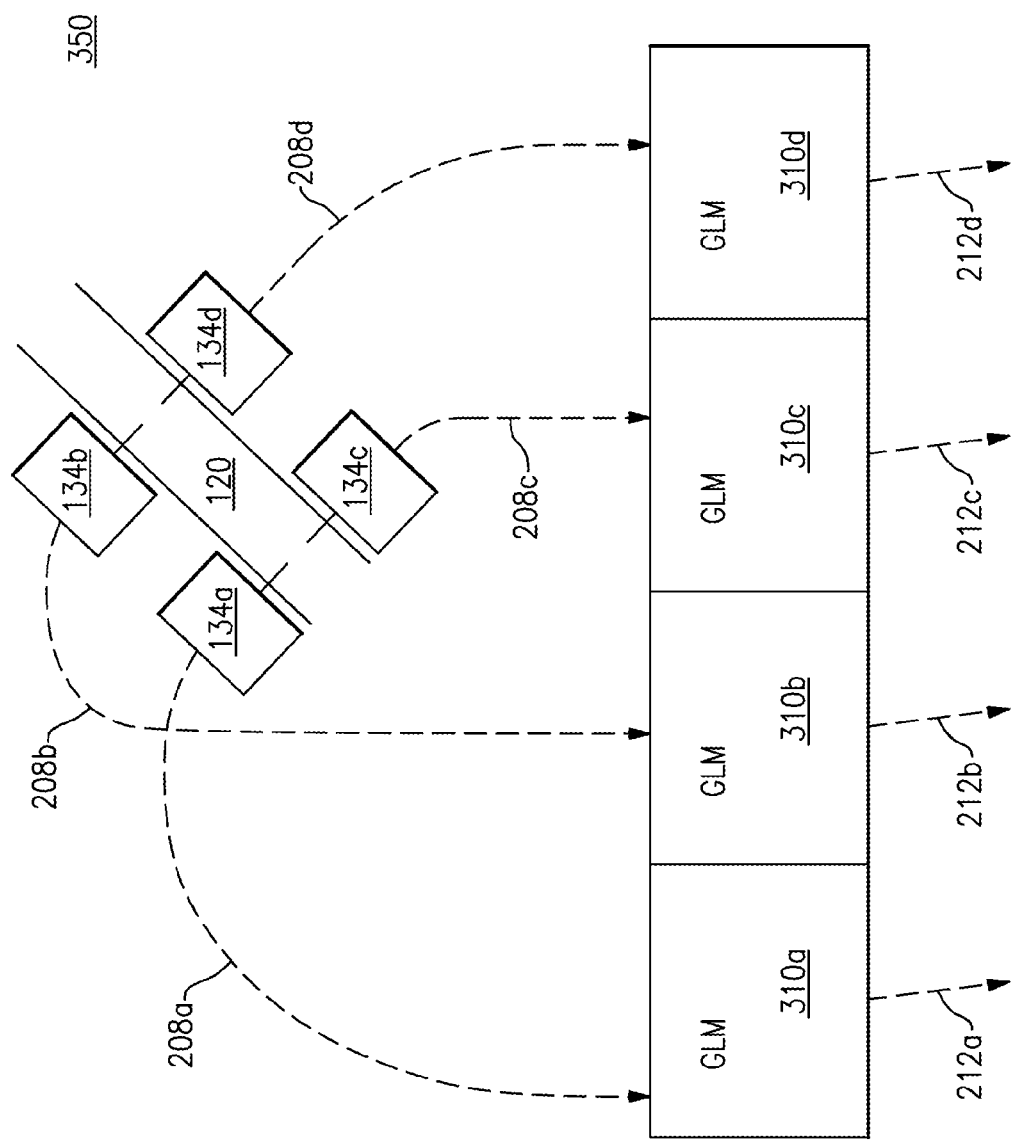

SYSTEM AND APPARATUS FOR PLANT MONITORING AND CONTROL

CROSS REFERENCE TO RELATED APPLICATIONS

This application is a continuation of co-pending U.S. patent application Ser. No. 13/165,347 filed Jun. 21, 2011, entitled SYSTEM AND APPARATUS FOR PLANT MONITORING AND CONTROL, which claims the benefit of U.S. Provisional Patent Application No. 61/357,792, filed Jun. 23, 2010, and entitled SYSTEM AND APPARATUS FOR PLANT MONITORING AND CONTROL, and claims the benefit of U.S. Provisional Patent Application No. 61/357,066 that was filed on Jun. 21, 2010, and entitled SYSTEM AND APPARATUS FOR PLANT MONITORING AND CONTROL. The disclosures of each of the aforementioned patent applications are hereby incorporated herein by reference in their entireties.

FIELD OF INVENTION

The present invention relates to a system and apparatus for monitoring and control of the operation of various types of industrial plants, including power plants, nuclear power plants and plants including various types of mechanical, electrical and chemical machinery. The invention employs non-microprocessor based digital hardware that enables communication between sensors and control logic and between the control logic and actuators that control a functional aspect of each plant.

BACKGROUND INFORMATION

Industrial plants are designed to employ various instruments for monitoring operation of various equipment within the plant. Based upon information provided by the instruments, corrective action may be taken to protect the integrity of each plant when one or more instruments indicate potential dangerous operation.

BRIEF DESCRIPTION OF THE DRAWINGS

The objects and features of the invention can be better understood with reference to the claims and drawings described below. The drawings are not necessarily to scale, and the emphasis is instead generally being placed upon illustrating the principles of the invention. Within the drawings, like reference numbers are used to indicate like parts throughout the various views. Differences between like parts may cause those like parts to be each indicated by different reference numbers. Unlike parts are indicated by different reference numbers.

FIGS. 3C-3D are simplified diagrams illustrating a relationship between sensor and actuator signals, and a monitoring and control system in accordance with the invention.

DETAILED DESCRIPTION

Figure 1:
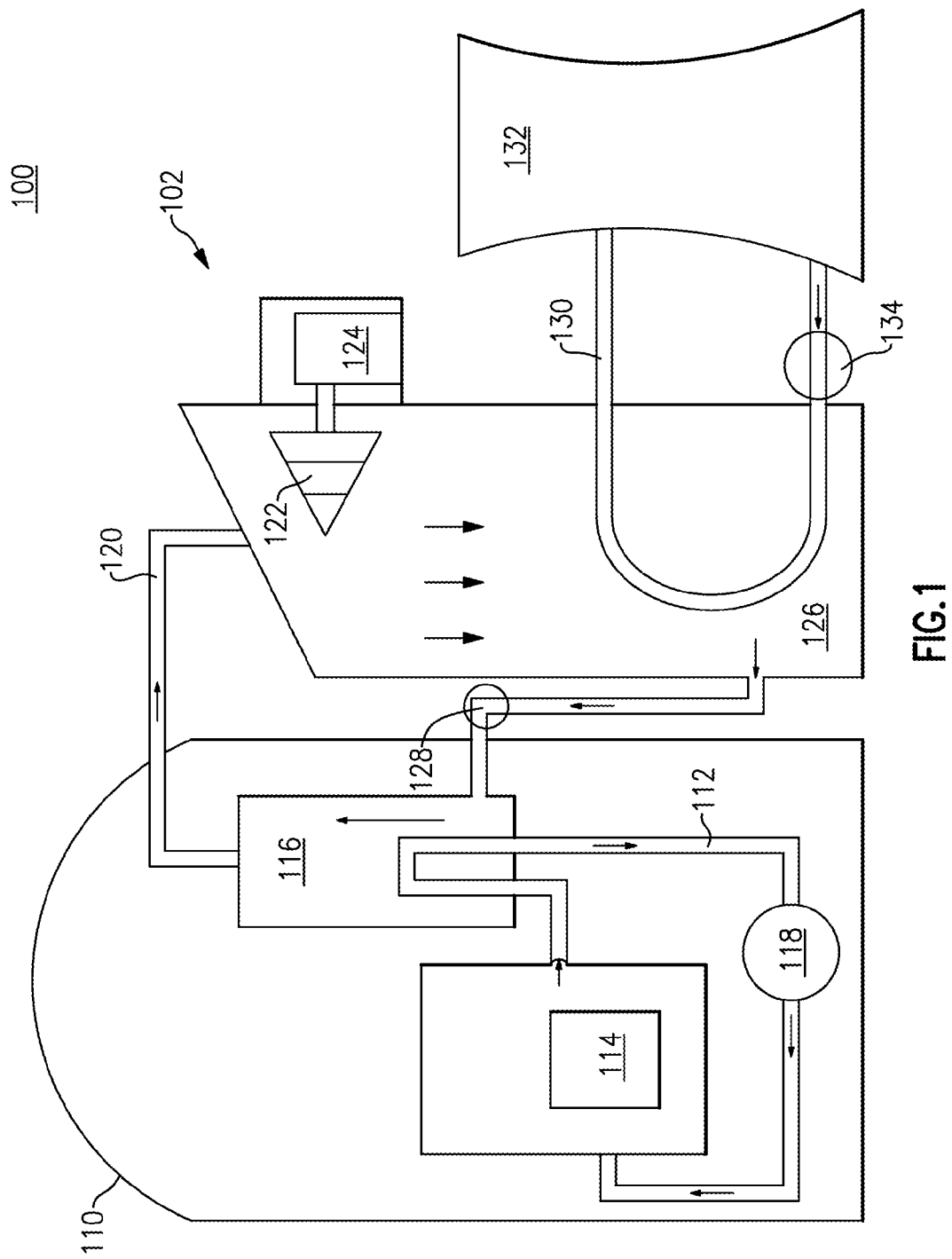
FIG. 1 is a simplified diagram illustrating an embodiment of a pressurized water nuclear power plant.

FIG. 1 is a simplified diagram 100 illustrating an embodiment of a pressurized water nuclear power plant 102. As shown, a reactor containment vessel 110 encloses a primary cooling loop 112, a nuclear reactor core 114 and a steam generator 116. The primary cooling loop includes a primary coolant pump 118 and is designed to transfer heat from the nuclear reactor core 114 to a steam generator 116.

The steam generator 116 receives heat from the primary cooling loop 112 to generate steam in a secondary cooling loop 120. The steam travels from the steam generator 116 through the secondary cooling loop 120 and through a turbine 122 to cause the turbine 122 to rotate. Rotation of the turbine 122 causes rotation of an electrical generator 124 and production of electrical power that can be stored and/or transferred over power lines to other locations and for various uses.

The steam that travels through the turbine 122 is collected and cooled into a liquid state within a condenser 126 that is located below the turbine 122. The cooled steam is also referred to as condensate that is pumped via a feed pump 128 through the secondary cooling loop 120 in order to return into the steam generator 116 to be re-heated into steam.

A third cooling loop 130 transfers heat from steam collecting within the condenser 126 to a cooling tower 132. A pump 134 transfers coolant that collects heat from the condenser and transfers the heat to a cooling tower 132. The cooling tower 132 transfers heat collected from the coolant of the third cooling loop 130 into the atmosphere residing outside of the power plant 102.

Figure 2:
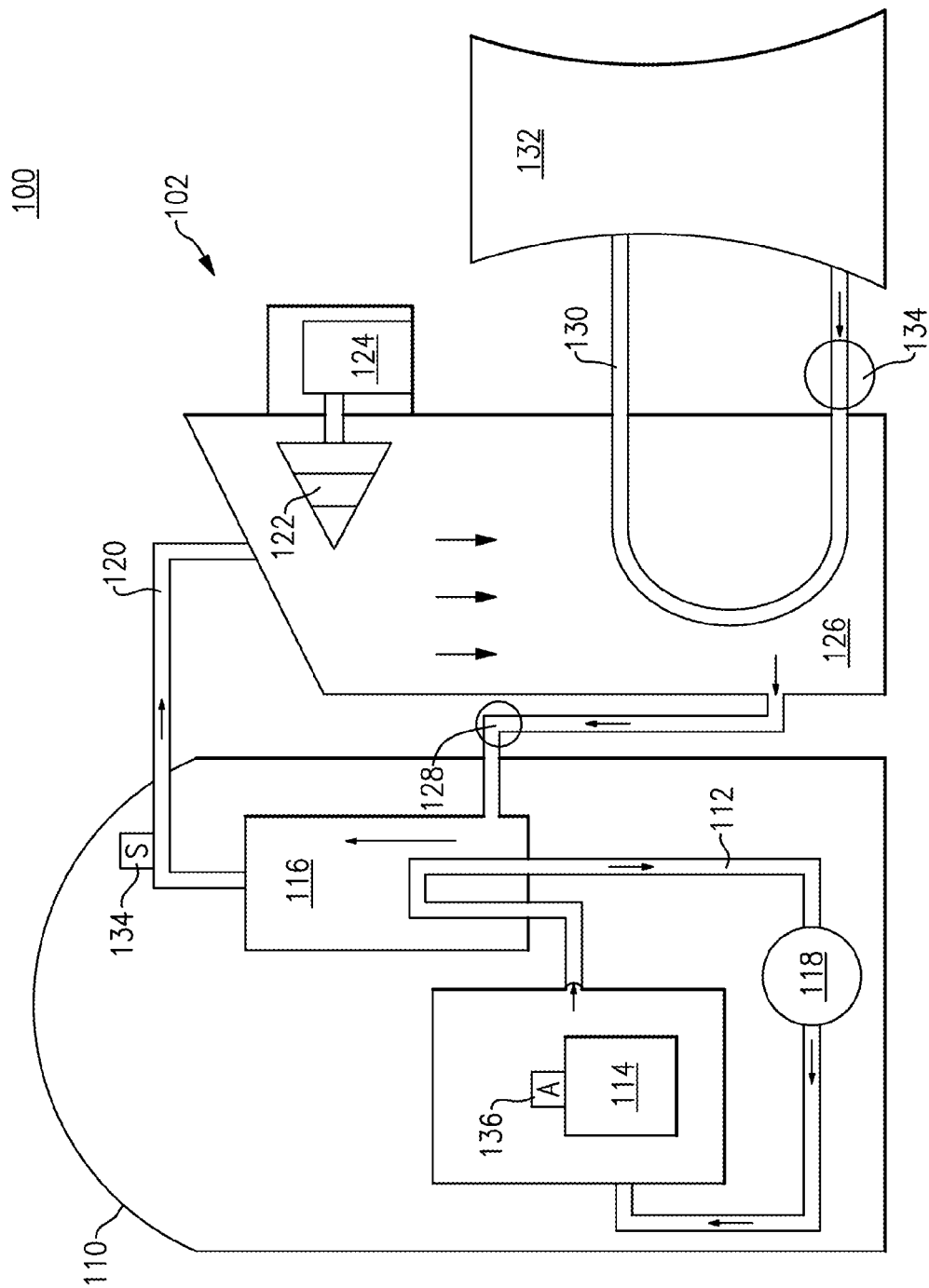
FIG. 2 is the simplified diagram of FIG. 1 including locations of a sensor and an actuator.

FIG. 2 is the diagram of FIG. 1 including placement of a sensor 134 and actuator 136 combination. As shown, a steam pressure sensor 134 is placed at a location along a segment of the secondary cooling loop near an outlet steam pipe of the steam generator 116. Hypothetically, if a steam leak from the secondary cooling loop occurs, great harm could be inflicted upon people and equipment located within the power plant 102. Such a steam leak could be detected by the sensor 134 as a sudden lowering of steam pressure within the secondary cooling loop.

The steam pressure sensor 134 is designed to monitor steam pressure along the secondary cooling loop at a location proximate to an outlet of the steam generator 116. In accordance with an embodiment of the invention. the steam pressure sensor 134 is implemented as a plurality (group) of (4) steam pressure sensors (not shown here) that each monitor steam pressure, independent from each other, at the location of the steam pressure sensor 134. Sensors can be implemented to measure a variety of measurable operating status parameters, including such as temperature, fluid pressure, fluid flow rate at each of various locations within the power plant 102. Also, sensors can be implemented as neutron flux detectors for measuring neutron flux at various locations relative to the nuclear reactor core 114.

Figure 3A:
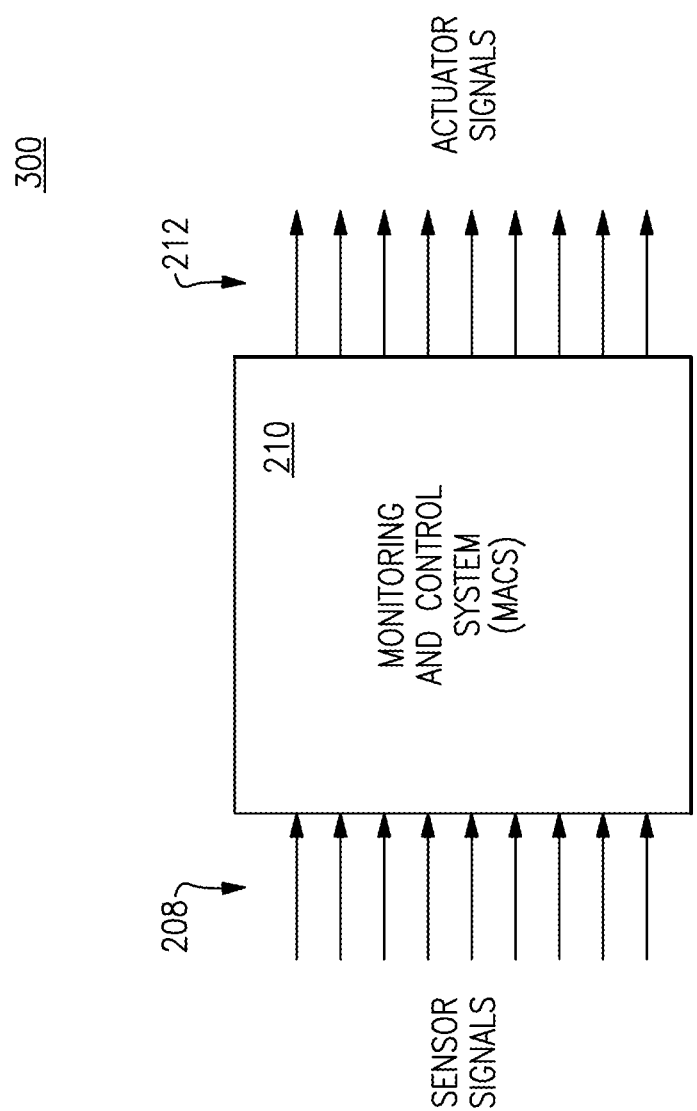
FIGS. 3A-3B are simplified diagrams illustrating a relationship between sensor and actuator signals, and a monitoring and control system.

FIG. 3A is a simplified block diagram illustrating a relationship between sensor signals 208, actuator signals 212 and a monitoring and control system 210. As shown, a monitoring and control system 210 receives signals 208 from one or more sensors, such as one or more sensors 134 (See FIG. 2), and outputs signals 212 to one or more actuators 136 (See FIG. 2). The monitoring and control system 210 can be implemented in a manner known in the prior art (See FIG. 3B), or alternatively, in accordance with the invention (See FIG. 3C).

Figure 3B:
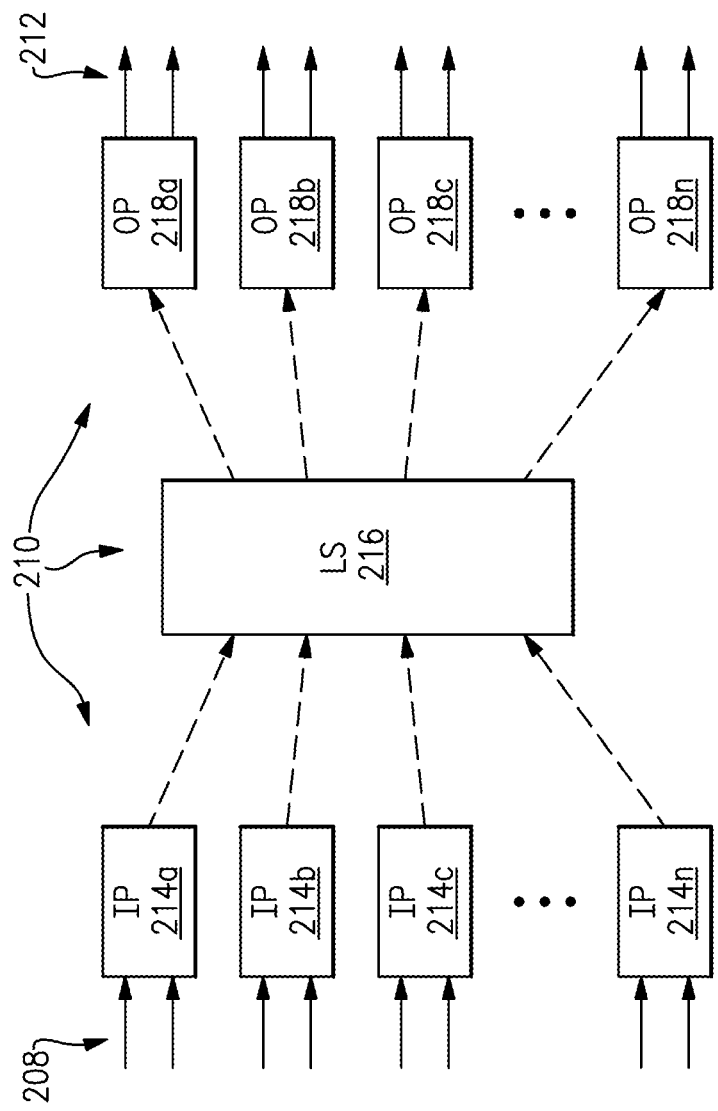

FIG. 3B is a simplified block diagram illustrating a relationship between sensor signals 208, actuator signals 212 and a monitoring and control system 210 in accordance with the prior art. As shown, the monitoring and control system 210 includes one centralized logic solving component 216 that interfaces with one or more input components 214 and interfaces with one or more output components 218.

The one or more input components 214a-214n are employed to received signals 208 from a one or more sensors 134. One or more output components 218a-218n are employed to transmit signals 212 to a one or more actuators 136. The logic solver component 216 acts as a central hub (switchboard) through which sensor signals 208 are received and processed and from which actuator signals 212 are optionally transmitted to actuators 136.

Figure 3C:
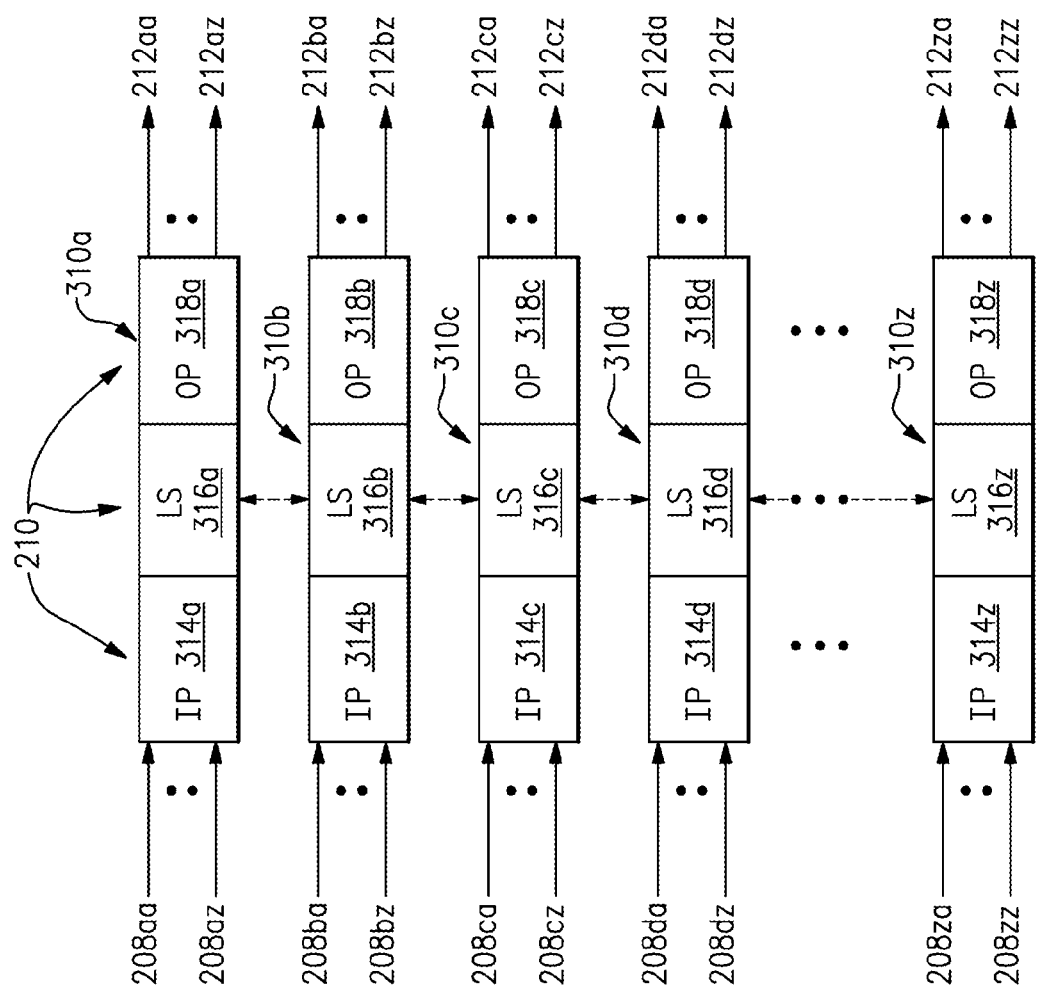

FIG. 3C is a simplified block diagram illustrating a relationship between sensor signals 208, actuator signals 212 and a monitoring and control system 210 in accordance with the invention. This system 210 is also referred to herein as the NuPac, DS3 or Digital Star Safety System (DSSS). As shown, the monitoring and control system 210 is divided (functionally partitioned) into separate generic logic modules (GLM) 310a-310z. Each generic logic module (GLM) 310a-310z includes a separate logic solving component 316a-316z. Within each GLM 310a-310z, each logic solving component 316a-316z interfaces with a respective input component 314a-314z and interfaces with a respective output component 318a-318z.

In accordance with the invention, the monitoring and control system 210 is deentralized (functionally partitioned) into a plurality of generic logic modules (GLM) 310a-310z. In some embodiments, each GLM 310a-310z is implemented as a circuit card (See FIG. 4A), also referred to herein as a circuit card assembly (CCA), that mechanically and electrically interfaces with a specially designed backplane (See. FIG. 4B) located within a chassis. The GLM input components 314a-314z are employed to received signals 208 from a one or more sensors 134. The GLM output components 318a-318z are employed to send signals 212 to one or more actuators 136. In some embodiments, the GLM input components 314a-314z and the GLM output components 318a-318z are implemented as mezzanine cards which mechanically and electronically attach to the GLM circuit card (See FIG. 4A).

Functional partitioning of input/output and logic solving functionality provides for design flexibility and enhanced redundancy and fault tolerance of the system as a whole. Also, GLMs 310a-310z can be inter-connected (electrically attached) and cascaded in a variety of series and/or parallel arrangements. Such arrangements can partition monitoring and control functionality to better delineate intuitively understandable aspects of monitoring and control functionality and to facilitate maintenance, testing and verification of designed and installed plant monitoring and control hardware.

FIG. 3D is a simplified diagram illustrating an embodiment of a relationship between sensors 134a-134d, a generic logic module (GLM) 310a-310d and actuators (not shown). As shown in FIG. 2 and here, a portion of the secondary cooling loop 120 is surrounded by (4) steam pressure sensors 134a-134d at a location downstream and proximate to the steam generator 116. Each sensor 134a-134d separately and independently communicates a sensor signal 208a-208d to one generic logic module (GLM) 310a-310d respectively, that is installed within a separate and respective chassis (not shown) and electrically attached to a back plane (See FIG. 4B) within each respective chassis. Each respective generic logic module (GLM) 310a-310d can be located in a separate location that a minimum distance from the location of other generic logic module(s) (GLM) 310a-310d (See FIG. 5).

Each GLM 310a-310d processes one respective sensor signal 208a-208d independent of the processing of any other sensor signal 208a-208d by any other GLM 310a-310d. Optionally, based upon processing of a respective sensor signal 208a-208d, each GLM 310a-310d can independently decide to communicate an actuator signal 212a-212d to an actuator 136 (not shown here) to direct performance of an action that the actuator 136 is designed to perform. For example, in circumstances where a steam leak is detected within the secondary cooling loop by a GLM 310a-310d, the GLM 310a-310d communicates an actuator signal 212a-212d to actuator 136 to insert control rods into the nuclear reactor core to shutdown the nuclear reaction within the nuclear reactor core. Optionally, the GLM can communicate another actuator signal to activate an alarm and/or display a plant status indicator to a plant operator, for example.

Each separate and independent communication path from a respective sensor 134a-134d to a respective GLM 310a-310d and to an actuator 136 is referred to as a division of monitoring and control. Each such division acts as a redundant mechanism. The redundancy of each division is designed to enable increased reliability for the system as a whole.

Figure 4A:
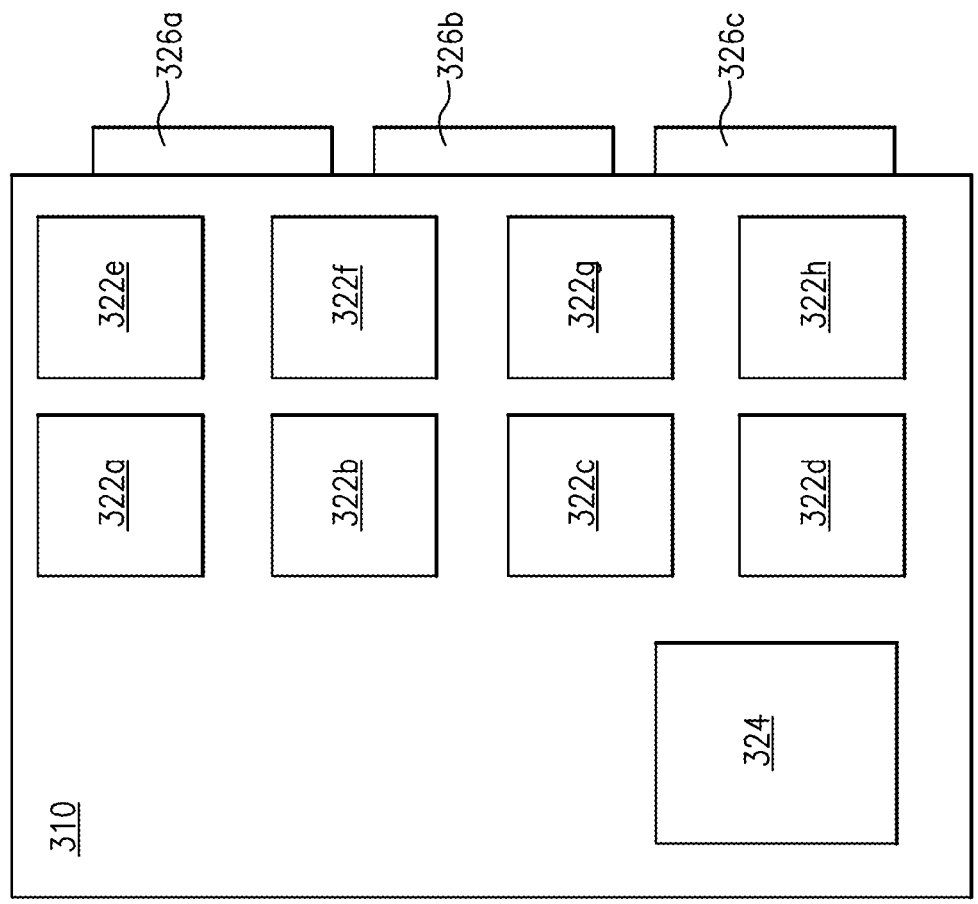
FIG. 4A is a simplified diagram illustrating a generic logic module (GLM).
Figure 4B:
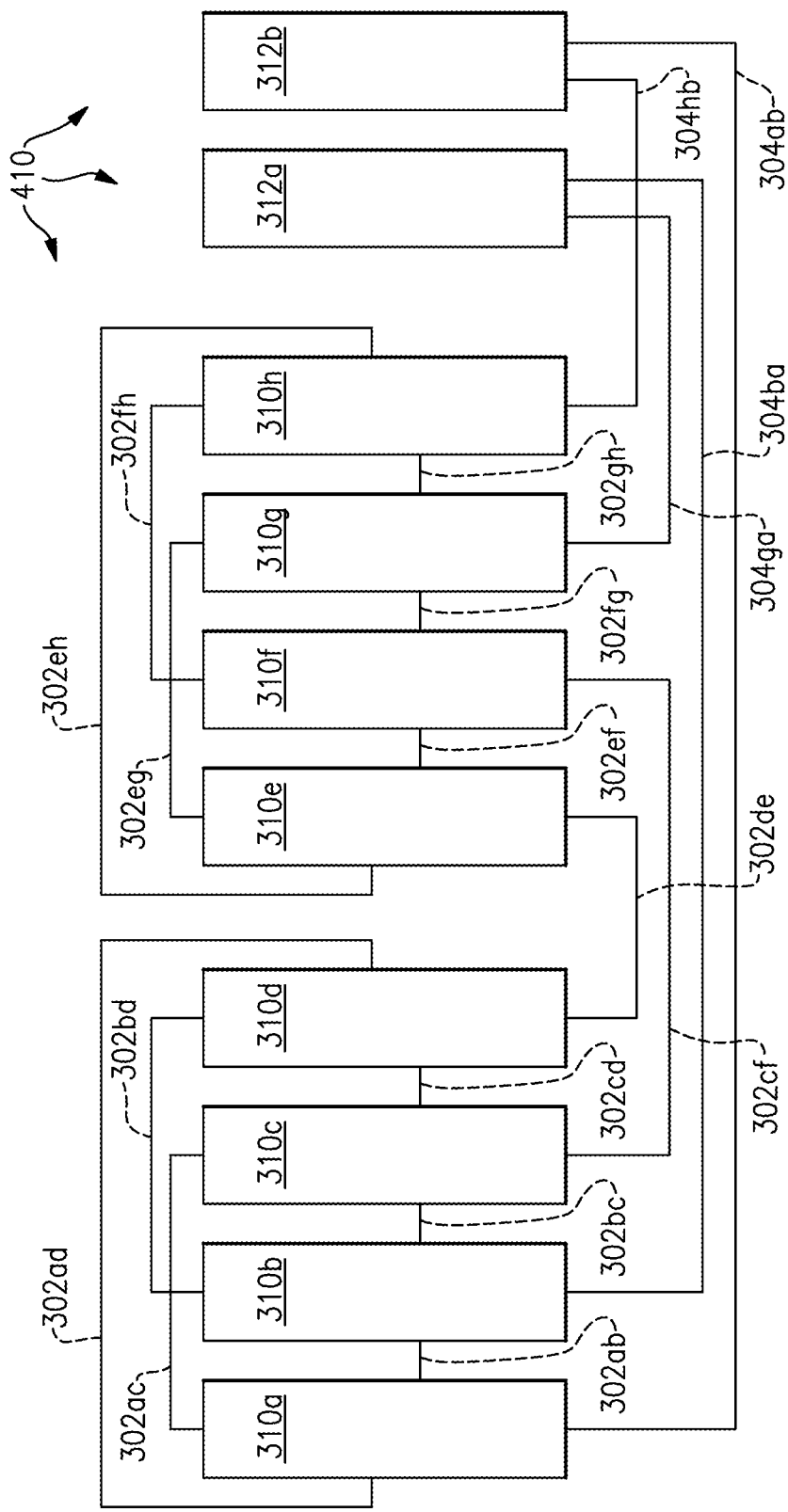
FIG. 4B is a simplified diagram illustrating a generic logic module backplane.

FIG. 4A is a simplified diagram illustrating a side view of an embodiment of the generic logic module (GLM) 310. As shown, the GLM 310 is implemented as a circuit card, also referred to herein as a carrier card, that is designed to mechanically and electrically attach to a backplane of a chassis (See FIG. 4B). The circuit card has exposed conductive contacts (326a-326c) that include electrodes (planar pins) that are designed to mechanically and electrically attach to the backplane. The GLM 310 also includes a plurality of up to (8) smaller I/O mezzanine circuit card slots which are configured to respectively receive mezzanine circuit cards 322a-322h and a ninth slot which is configured to respectively receive a logic mezzanine circuit card 324. The carrier card housing the GLM 310 is about the size of a laptop computer while the mezzanine cards 322a-322h that can be attached to the GLM 310 are each about the size of a credit card.

The (8) I/O mezzanine circuit card slots 322a-322h can receive a variety of Input Output I/O mezzanine circuit cards that perform the input functions 314a-314z and/or the output functions 318a-318z functions shown in FIG. 3C. The specific types of input and output functionality can be customized (mixed and matched) for each configured Generic Logic Module (GLM) 310 shown in FIG. 3D. Input and/or output functionality or other types of functionality can be customized and assigned to any or all of these (8) I/O mezzanine circuit card slots 322a-322h in a variety of arrangements. Optionally, one or more mezzanine slots 322a-322h that are configurable to receive the mezzanine cards can be instead assigned to remain empty.

This I/O functionality provided by each of the mezzanine cards includes, but is not limited to, RS-485 serial interface, digital input interface, analog input interface, digital output and analog output, relay drivers, relays types of interfaces. Processing of temperature input from a temperature sensing device is also provided.

These mezzanine card based components also include Analog to Digital Converters (ADC) for processing of analog signals that are incoming from sensors 134, and include digital to analog converters (DAC) for processing of analog signals that are outgoing to actuators 136. These types of I/O components can be configured to input and process a variety of incoming signal types and can be configured to generate a discrete output in response to such types of input. The GLM 310 also includes Built In Test (BIT) circuitry that enables each GLM to self test during power up and periodically during operation of the GLM. The I/O (input/output) on these mezzanine cards 322*a*-322*h* and 324 are designed to satisfy class 1E to non 1E isolation.

An I/O mezzanine card 322*a*-322*h* can be configured to perform A/D conversion of an incoming analog signal to a digital signal and to transfer digital information represented by that analog signal to the core FPGA. The core FPGA further extracts information received via the incoming analog signal and transfers digital information (accurate and filtered measurement information) to the application specific FPGA.

The logic mezzanine circuit card 324 includes at least one field programmable gate array (FPGA) and preferably at least two FPGA(s). The field programmable gate array (FPGA) is designed to be programmable with the use of specialized equipment that is generally not available within a power plant. Hence, such a design reduces a likelihood of accidental or intentional FPGA programming modification within the confines of the plant. Typically, an FPGA would be replaced by another differently programmed FPGA or be moved to a location away from a power plant in order to be re-programmed, if desired.

Preferably, the GLM 310 via the logic mezzanine circuit card 324, includes a core field programmable gate array (CFPGA) and an application specific field programmable gate array (ASFPGA). The core FPGA controls interfacing with communications hardware, for the purpose of processing inbound communications, such as sensor signal input sampling and for the purpose of controlling outbound communications to external devices, such as for example, actuators, indicators, alarms etc. The core FPGA samples incoming signals and performs conversion of electrical properties of the signal, to represent other units of measurement, such as for example temperature units of degrees Celsius or Fahrenheit, or to units of pressure of pounds per square inch. In some embodiments, the interface between the core FPGA and the application specific FPGA employs time division multiplexing and fixed bandwidth allocation.

The application specific FPGA is configured to perform decision making and optimal action in accordance with end user defined logic and in accordance with the accurate and filtered measurement information received from at least one sensor via the core FPGA. Note that a core FPGA may be configured to input many sensor signal provided samples of a measurement over an interval of time and configured to perform a mathematical operation upon those samples. For example, in some embodiments, the core FPGA receiving a sensor signal computes a mathematical average the most recent (10) samples in time. The averaged signal is then converted into an engineering unit of measurement, such as degrees Celsius.

The application specific FPGA is designed to perform some action, such as by performing transmission of a signal 212 to an actuator 136. Such an action could activate an alarm, open or close a valve or insert control rods into the nuclear reactor core etc. The digital logic residing within the application specific FPGA can be customized to perform one type of action, such as insertion of reactor control rods, which terminates the operation of the reactor core. This is one type of shutdown that is also referred to as a type of "trip". An application specific FPGA can be customized to perform a temperature limit related "trip" or a pressure limit related "trip", for example.

An advantage of using one or more field programmable arrays, is that the digital logic content stored within a FPGA is less likely to be corrupted as compared to software that is stored into memory for controlling a micro-processor. Also, a simple deterministic FPGA design allows for hardware-level testing to perform proper verification of the operation of the digital logic content within the FPGA.

An advantage to dividing the digital logic content between the core FPGA and the application specific FPGA is that the type of logic that is stored within the core FPGA is likely to be common to many if not all customized GLMs 310, regardless of how each particular GLM is configured (customized) in accordance with end user defined logic that is specific to each GLM 310. The logic content of the core FPGA is designed to function like a computer operating system, in that it is designed to perform more commonly used and/or more generic functions to assist a variety of different types of application software programs, which are analogous to the logic content among a plurality of application specific FPGAs.

Furthermore, the logic content within a core FPGA is less likely to be frequently revised as compared to that of an application specific FPGA, and can be verified once during the useful lifetime of many individually configured (customized) GLMs. However, the logic content of an application specific FPGA, typically varies across a population of differently configured (customized) GLMs and this type of FPGA is more likely to be frequently revised and verified, as compared to a core FPGA, over a life time of each of many individually configured GLMs.

FIG. 4B is a simplified diagram illustrating a generic logic module (GLM) backplane 410. As shown in this embodiment, a plurality of (8) generic logic modules (GLM) 310*a*-310*h* and other hardware 312*a*-312*b* are attached (mechanically and electrically connected) to a backplane 410. These GLMs 310*a*-310*h* are divided into a first group (cluster) 412*a* that includes (4) GLMs 310*a*-310*d* and divided into a second group (cluster) 412*b* that includes (4) GLMs 310*e*-310*h*. The backplane 410 is designed to provide multiple direct electrical connections (communication paths) between individual GLMs 310*a*-310*h* that are attached to the backplane 410 and is designed to provide direct electrical connections (communication paths) between the GLMs 310*a*-310*h* and other hardware 312*a*-312*b* that is attached to the backplane 410.

This other hardware includes communication circuit cards (CCC) 312*a*-312*b* and power supply modules (not shown here). A direct electrical connection, for example direct connection 302*ab*, shown here as one line between backplane components, like all other direct connections 302 shown here, each actually represents (2) transmit and (2) received communication paths. The GLMs 310*a*-310*h*, communication circuit cards (CCC) 312*a*-312*b* and power supply modules attach to the backplane 410 by each being inserted into a device interface slot (not shown) provided by the backplane 410.

With respect to the first group (cluster) 412*a*, the communication path 302*ad* provides a direct connection between GLM 310*a* and GLM 310*d*. Communication path 302*ac* provides a direct connection between GLM 310*a* and GLM 310*c*. Communication path 302*bd* provides a direct connection between GLM 310*b* and GLM 310*d*. Additionally, communication path 310*ab* provides a direct connection between GLM 310*a* and GLM 310*b*, which are located adjacent to each other. Communication path 310*bc* provides a direct connection between GLM 310*b* and GLM 310*c*, which are located adjacent to each other. Communication path 310*cd* provides a direct connection between GLM 310*c* and GLM 310*d*, which are located adjacent to each other. Hence every GLM 310*a*-310*d* residing within the first cluster 412*a* is provided a direct connection to every other GLM 310*a*-310*d* within that first cluster 412*a*.

With respect to the second group (cluster) 412*b*, the communication path 302*eh* provides a direct connection between GLM 310*e* and GLM 310*h*. Communication path 302*ag* provides a direct connection between GLM 310*a* and GLM 310*g*. Communication path 302*fh* provides a direct connection between GLM 310*f* and GLM 310*h*.

Additionally, communication path 310*ef* provides a direct connection between GLM 310*e* and GLM 310*f*, which are located adjacent to each other. Communication path 310*fg* provides a direct connection between GLM 310*f* and GLM 310*g*, which are located adjacent to each other. Communication path 310*gh* provides a direct connection between GLM 310*g* and GLM 310*h*, which are located adjacent to each other. Hence every GLM 310*e*-310*h* residing within the second cluster 412*b* is provided a direct connection to every other GLM 310*e*-310*h* residing within that second cluster 412*b*.

The backplane 410 also provides for direct connections between GLMs 310*a*-310*h* residing within different clusters 412*a*-412*b*. Connection 302*de* provides a direct connection between GLM 310*d* residing in the first cluster 412*a* and GLM 310*e* residing in the second cluster 412*b*. Direct connection 302*cf* provides a direct connection between GLM 310*c* residing in the first cluster 412*a* and GLM 310*f* residing in the first cluster 412*a*.

The backplane 410 also provides slots to receive communication circuit cards (CCC) 312*a*-312*b*. The backplane 410 also provides for direct connections (communication paths) between some individual GLMs 310*a*-310*b* and 310*g*-310*h* and the communication circuit cards 312*a*-312*b*. Direct connection 304*ab* provides a direct connection between GLM 310*a* and CCC 312*b*. Direct connection 304*ba* provides a direct connection between GLM 310*b* and CCC 312*a*. Direct connection 304*ga* provides a direct connection between GLM 310*g* and CCC 312*a*. Connection 304*hb* provides a direct connection between GLM 310*h* and CCC 312*b*.

In some embodiments, the backplane includes a low voltage differential signaling (LVDS) data bus and employs a point to point serial data link topology and communication between GLM's employing Spacewire and IEEE 1355. Also, Standard UART Encoding, wormhole routing and ECC (Error check correction parity) are employed. This arrangement is also referred to herein as a redundant/ grouped mesh-star LVDS topology.

In other embodiments, the above described backplane 410 can be expanded to accommodating more than (2) clusters of GLMs and/or can accommodate clusters of GLMs having less than or greater than (4) GLMs residing within each cluster 412 as shown and described here. For example, a preferred embodiment includes (4) clusters of (4) GLMs in combination with (2) communication circuit cards (CCC).

Figure 4C:
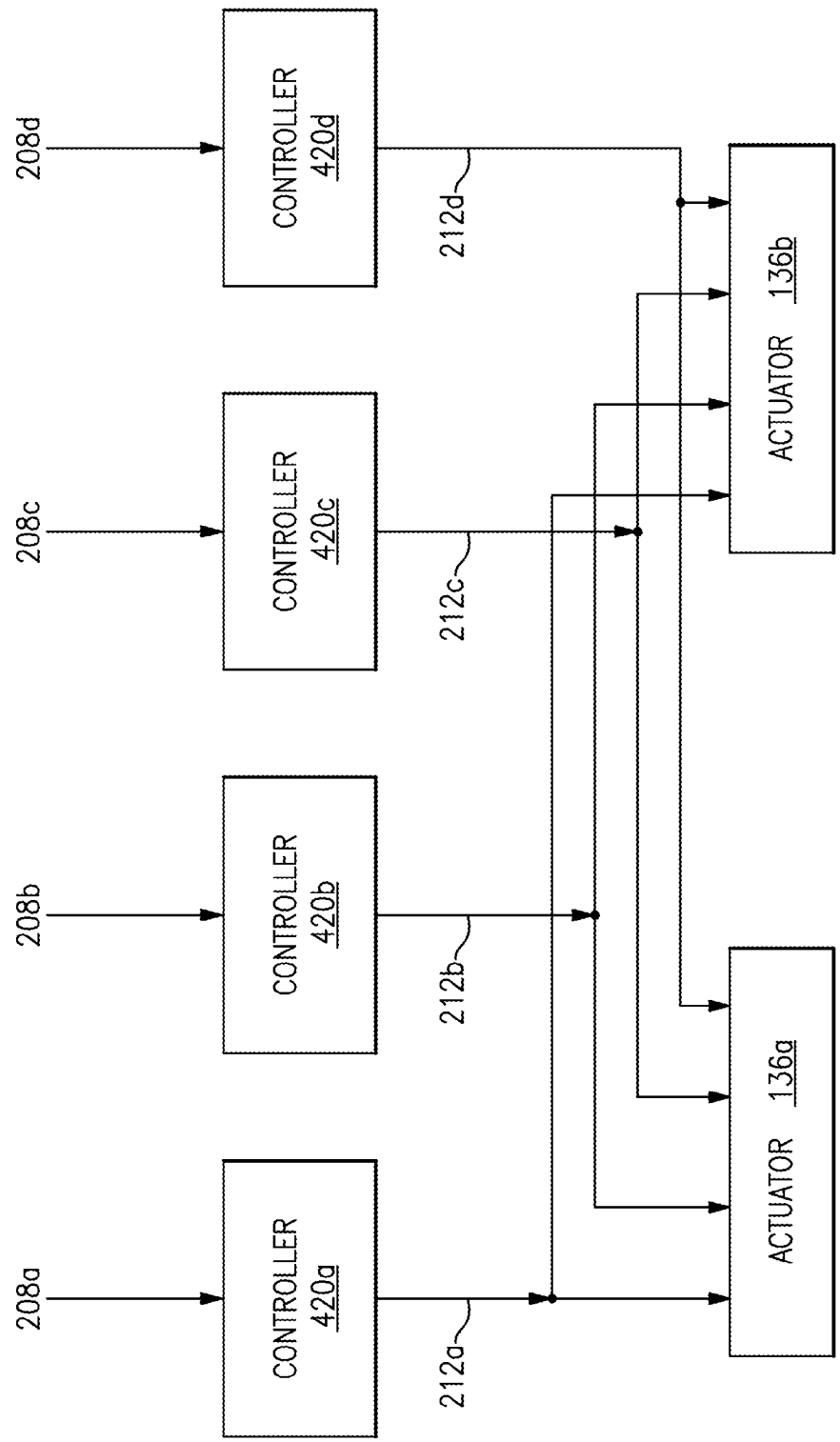
FIG. 4C is a simplified diagram illustrating controllers and actuators in accordance with the invention.

FIG. 4C is a simplified diagram illustrating controllers 420*a*-420*d* and actuators 136*a*-136*d* in accordance with the invention. As shown, a sensor signal 208*a*-208*d* is received and processed by a controller 420*a*-420*d*. Optionally, each controller 420*a*-420*d* performs a decision to optionally perform an action via an actuator 212*a*-212*b*.

Each controller 420*a*-420*d* represents a combination of a chassis including a rear transition module (RTM) and a generic logic module (GLM) that are each attached to a backplane 410 within the chassis (not shown). The rear transition module (RTF) (not shown) provides multiple externally accessible connectors that are each configured to connect to one first end of each attached field wire. A second opposite end of each attached field wire is configured to connect to either a sensor 134 or to an actuator 136. In some embodiments, the externally accessible RTF connectors are known as bulkhead type connectors.

Describing a typical use scenario in accordance with an embodiment of the subject matter of the invention, a sensor generated signal is transmitted from a sensor 134 through a field wire to an RTM via an RTM connector (not shown). The RTM is electrically attached to a backplane within a chassis of a controller 420 and is associated with a generic logic module (GLM) 310 residing within the chassis of the controller 420. Via the RTM, the signal travels through the backplane of the chassis of the controller 420 into the generic logic module (GLM) 310 via an input component implemented within a mezzanine card that is mechanically and electrically attached to the GLM 310 via at least one slot 322*a*-322*h* of the GLM 310 (See FIG. 4A).

The sensor signal is converted into a digital representation and processed by a core field programmable gate array (FPGA) that resides on a logic mezzanine circuit card that is mechanically and electrically attached to the GLM via a slot 324 of the GLM 310 (See FIG. 4A). The core FPGA transfers information representing the signal to an application specific field programmable gate array (FPGA) which further processes the signal and decides upon whether to optionally perform some action in response to the signal.

When a decision to perform some action is positively made by the application specific FPGA, a directive for transmission of an actuator signal is initiated from the application specific FPGA. The actuator signal travels through an output component implemented within a mezzanine card that is mechanically and electrically attached to the GLM 310 via at least one slot 322*a*-322*h* of the GLM 310. In some embodiments, the input and output components are located on the same mezzanine card 322*a*-322*h*. The actuator signal travels from the GLM 310 through the backplane to the RTM associated with the GLM 310, through an RTM connector and through a field wire attached to at least one actuator 136 and to preferably two actuators 136*a*-136*b* (See FIG. 4C). Note that the RTM connector that is associated with, and field wire that is attached to the actuator 136 is separate and different from the RTM connector that is associated with, and field wire that is attached to the sensor 134. Both of these connectors are attached to the same RTM that is associated with the GLM 310.

Referring back to FIG. 4C, when an actuator signal 212*a*, 212*b*, 212*c* and/or 212*d* is generated, each signal 212*a*-212*d* is transmitted from a respective controller 420*a*-420*d* to both actuator 136*a* and actuator 136*b*. These actuator signals 212*a*-212*d* are transmitted in a redundant manner with respect to each other. The transmission of only one actuator signal 212*a*-212*d* is required to cause one or both of the actuators 136*a*-136*b* to actuate. Only one of the (2) actuators is required to actuate to perform the actuator designed action. Hence, if only one actuator 136*a*-136*b* should fail to actuate, the other actuator 136*a*-136*b* would perform the actuator designed action, such as for example, the closing of a valve, the generation of an alarm, or the insertion of control rods etc.

In some embodiments, (4) sensors 134 (See FIG. 3D) are each divided into (4) redundant groups. In some embodiments, each of (2) of (4) sensors that detect a violation of a pre-determined set point, will send an sensor signal 212 indicating such a violation to a controller 420a-420d. Each receiving controller 420a-420d is configured to decide to send an actuator signal 212 to both actuators 136a-136b to perform an actuator designed action in response to the detection of the violation of the pre-determined set point by at least (2) of (4) sensors monitoring the set point. Alternatively, if instead, only (1) of (4) sensors detect a violation of a pre-determined set point, the receiving controller 420a-420d may be configured to perform no action, or instead may generate an actuator signal 212 that notifies an operator of the (1) sensor indicating the violation of the pre-determined set point.

Figure 5:
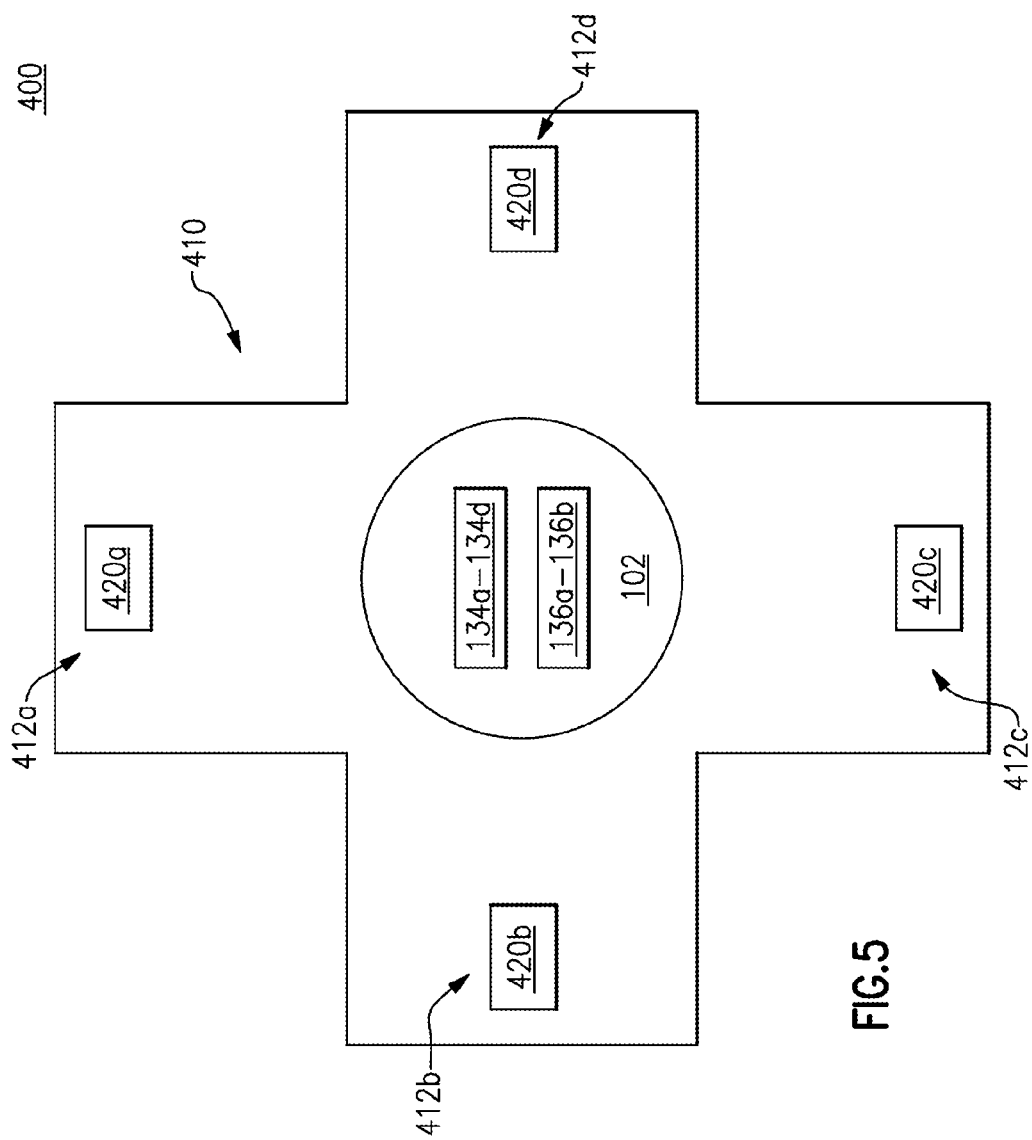
FIG. 5 is a simplified diagram illustrating a spatial relationship between locations of sensors, actuators and generic logic modules.

FIG. 5 is a simplified diagram illustrating a spatial (geographical) relationship between locations of (4) sensors 134a-134d and (2) actuators 136a-136b within a power plant 102 and locations 412a-412d of controllers 420a-420d. The controllers 420a-420d each respectively include one of the generic logic modules 310a-310d. The controllers 420a-420d each respectively reside within one of (4) separate and redundant communication paths for monitoring of operation of the power plant 102.

As shown, locations within the power plant 102 that have associated sensors 134a-134d or actuators 134a-134b are represented in the center of a cross shaped geographical area 410. Locations of each of the (4) controllers 420a-420d are respectively represented by locations 412a-412d, which are intended to be separated from each other by a minimum practical distance, for example in some circumstances the minimum practical distance being 50 meters or more from each other.

As a result of diversifying the location of each controller 420a-420d, an occurrence of an accident that damages the operation of one controller 420a-420d at one location, for example 412a, is less likely to affect operation of the controllers 420b-420d which reside at the other locations 412b-412d, at least for a sufficiently long enough period of time to prevent performance of a corrective action by an actuator 136a-136b via transmission of an actuator signal that is generated from at least one of the other controllers 420b-420d. Such action could range from activating an alarm to performing a control rod insertion (shutdown) of the nuclear reactor core within the power plant 102.

Each controller 420a-420d is configured to operate as independently as practical from any other 420a-420d, in order to maximize independence, redundancy and reliability of each division of logic control.

In one embodiment of a configuration of this system, each controller 420a-420d receives (4) sensor signals 208a-208d that are respectively transmitted from each of (4) sensors 134a-134d. One or more GLMs 310 within each controller 420a-420d are configured to receive and process each of the sensor signals 208a-208d. If at least one controller 420a-420d detects that at least (2) of the (4) sensor signals 208a-208d indicate a set point violation (over limit) value, such as for example, exceeding a temperature limit, that one controller 420a-420d is pre-designed to decide upon corrective action and can optionally transmit an actuator signal 212 to both actuators 136a-136. Typically, if all (4) sensors are working properly and all (4) controllers 420a-420d are working properly, each of the (4) controllers 420a-420d will operate as designed and each will decide and transmit an actuator signal 212a-212d independently of each other.

These generic logic modules (GLMs) can be interconnected (electrically attached) and cascaded in various configurations. In some embodiments of the system, a plurality of GLMs 310a-310d can each generate an output that is directed (funneled) to one receiving GLM 310e, which is a type of a cascading arrangement.

For example, with respect to the scenario described above, each sensor signal 208a-208d be processed by a separate GLM 310aa-310ad (not shown). Each of those separate GLMs 310a-310d can respectively decide if any of the received sensor signals 208a-208d indicates a set point violation (over-limit) value and generate an output signal to a another fifth GLM 310ae that receives an output signal from each of the (4) GLMs 310aa-310ad. Each output signal represents the result of processing a respective one of the (4) sensor signals 134a-134b. If the receiving fifth GLM 310ae detects that at least (2) of the (4) GLM output signals indicates the set point violation (over-limit) value, then the fifth GLM 310ae will decide and transmit an actuator signal 212ae to the actuators 136a-136b to perform at least one corrective action.

Because each GLM 310 can interface with many inputs and many outputs, a first GLM can interface with for example, (2) temperature inputs, (2) pressure inputs and a flow input from (5) sensors that are each separately located in (5) different locations throughout a power plant. A second GLM can also have (2) temperature inputs, (2) pressure inputs and a flow input from (5) sensors that are each separately located in the same (5) different locations throughout a power plant as for the first GLM. Hence, each GLM resides within a different division and can be configured to operate as a separate and redundant communications path between one or more sensors 134 and one or more actuators 136 that are located at one or more locations relative to the plant 102.

In some embodiments, the above described system and apparatus, including the GLM, the backplane, RTM and associated hardware including sensors, actuators, field wiring etc. are designed and manufactured in accordance with the requirements of USNRC Regulatory Guides (RGs) and Institute of Electrical and Electronics Engineers (IEEE) standards applicable to nuclear power plant (NPP) safety-related applications. These guides and regulations are referred to in Title 10 of the Code of Federal Regulation Section 50.55a(h) and RG 1.153, which endorses IEEE Standard 603-1991.

Because the above described system and apparatus, also referred to herein as the NuPAC platform, is classified a digital device (system and apparatus), the RG 1.152 and IEEE Standard 7 4.3.2-2003 also apply. The development process for this system and apparatus also referred to guidance provided in RGs 1.168, 1.169, 1.170, 1.171, 1.172, and 1.173, as well as the Digital Instrumentation and Control Interim Staff Guidance (DI&C-ISG) associated with nuclear power plant (NPP) digital instrumentation and control (I & C).

Such design and manufacturing activity is performed under a Title 10 of the Code of Federal Regulations Part 50 (10 CFR 50) Appendix B-compliant quality program, which complies with Nuclear Quality Assurance (NQA)-1-1994, RG 1.28, ANSI N45.2-1977, and associated daughter standards for basic components.

In summary, one aspect of the invention provides for a generic logic module (GLM) for monitoring and control of an industrial plant or power plant, the GLM includes a main circuit card that is configured to electrically attach to a backplane; the GLM main circuit includes one or more input components that are electrically attached (connected) to the main circuit card and that are each configured to receive at least one first sensor signal from a sensor component; the GLM main circuit includes one or more output components that are electrically attached (connected) to the circuit card and that are each configured to transmit at least one second actuator signal to an activator component.

The GLM main circuit card further includes at least one logic solving component that is electrically attached (connected) to said main circuit card and that is configured for processing (continuously monitoring) said first sensor signal and configured for a determination of (as to) if and when to transmit said second actuator signal; and where the logic solving component executes digital logic within electronic hardware that excludes microprocessor hardware and excludes software, such as software stored in random access, flash or read only memory.

In some embodiments, the generic logic module includes at least one field programmable gate array (FPGA) that is employed to execute at least some of said digital logic. Preferably, the generic logic module of claim 1 further includes a first core field programmable gate array (FPGA) and a second application specific field programmable gate array (FPGA) and where the application specific FPGA includes digital logic that is configured for end user customization of the processing and determination actions and where the first core field programmable gate array (FPGA) provides support for the decisions of the second application specific field programmable gate array (FPGA).

In some embodiments, the generic logic module (GLM) is configured to monitor and process a first type of plant operating status and where a second generic logic module (GLM) is configured to monitor and process the first type of plant operating status, and where the first GLM and the second GLM operate independently and in parallel with respect to each other while both GLMs are electrically attached to a common backplane.

In some embodiments, the generic logic module (GLM) is configured to monitor and process a first type of plant operating status and where a second generic logic module (GLM) is configured to monitor and process a second type of plant operating status, and where the first GLM and the second GLM operate independently and in parallel with respect to each other while each of these GLMs is separately electrically attached to a common backplane.

In some embodiments, a first generic logic module (GLM) and a second generic logic module (GLM) are each configured to optionally communicate with each other while each of the first and second GLM is separately attached to a common backplane.

In some embodiments, a first generic logic module (GLM) and a second generic logic module (GLM) are each configured to electrically communicate to each other so that an output signal of the first GLM is transferred as an input signal to the second GLM while each of the first and second GLM is separately electrically attached to a common backplane.

The generic logic module where at least some of said input components are implemented as at least one mezzanine circuit card that is electrically attached to the main circuit card via at least one slot provided by the main circuit card. The generic logic module where at least some of said output components are implemented as at least one mezzanine circuit card that is electrically attached to the main circuit card via at least one slot provided by said main circuit card. In some embodiments, the generic logic module (GLM) main circuit card further includes self test capabilities that executes during power up and during operation of the GLM main circuit.

In another aspect, the invention provides for a backplane for electronic interface with a plurality of circuit cards, the backplane includes a plurality of device interface slots that are each configured to receive a circuit card, at least one communication slot that is configured to receive a circuit card that is configured to enable communication between other circuit cards, includes a plurality of communication paths that each span between two device interface slots; and where the device interface slots are grouped into one or more clusters of slots, each of the cluster of slots including a plurality of two or more slots; and wherein each circuit card residing within a first cluster of slots is provided a direct communication path to any other circuit card residing within the first cluster of slots.

Optionally, at least one circuit card residing within the first cluster of slots has a direct communication path to a circuit card residing within a communication slot. Optionally, at least one circuit card residing within the first cluster of slots has a direct communication path to a circuit card residing within a second cluster of slots. Optionally, at least one circuit card residing within said second cluster of slots also has a direct communication path to a circuit card residing within the communication slot.

In some embodiments, the backplane is configured to mechanically and electronically interface with a main circuit card of a generic logic module. In this embodiment, each of a plurality of generic logic module (GLM) main circuit cards operate independently of each other while electronically attached to the backplane. In this embodiment, a first and a second generic logic module (GLM) main circuit cards each interface with at least one respective sensor and one respective actuator along a first and second communications path respectively, through the backplane where each said first and second communications path is separate and independent from each other.

In this embodiment, a first generic logic module (GLM) is provided a communications path via the backplane to a first rear transition module (RTM), and a second generic logic module (GLM) is provided a communications path via said backplane to a second rear transition module (RTM), while each of the first and second GLM is electronically attached to a separate respective device interface slot. In this embodiment, the first and second generic logic module (GLM) main circuit cards are each configured to interface with a plurality of sensors and a plurality of actuators via each of said first and second rear transition modules (RTM) respectively.

Optionally, a plurality of generic logic module (GLM) main circuit cards are each configured to communicate with any other GLM main circuit card that is electronically attached to a common backplane.

In another aspect, the invention provides for a system and apparatus for monitoring and control of a nuclear power plant, the system and apparatus includes a sensor configured to monitor an operational status of a power plant over time, such as a temperature or a pressure or neutron flux over time, and configured to communicate a sensor signal representing a value of said operational status, over time; and includes an actuator that is configured to perform an action associated with the operational status of said power plant.

The system and apparatus also includes at least one generic logic module that is configured to perform a determination of an action associated with a combination of one or more operational status(s), the determination being dependent upon processing of the sensor signal received from the sensor, and configured to communicate an actuator signal to the actuator to perform the action; and where the generic logic module executes digital logic for processing of the sensor signal, and where implementation of the digital logic excludes microprocessor based electronic hardware and excludes software such as would be stored in random access memory, flash memory or read only memory (ROM).

In some embodiments, at least one generic logic module includes at least one field programmable gate array. In some embodiments, a first generic logic module (GLM) and a second generic logic module (GLM) are each connected to backplane and where each of said first and second GLMs operate independently of each other and can each communicate with at least one sensor and at least one actuator through (via) the backplane.

In some embodiments, each of a plurality of generic logic module (GLM) main circuit cards interface (communicate) with at least one respective sensor and one respective actuator along a communications path through the backplane that is separate and independent from a communication path employed for interface between another GLM main circuit card and another sensor and actuator.

In another aspect, the invention provides for a system for monitoring and control of a nuclear power plant, the apparatus comprising, a sensor configured to monitor an operational status of a power plant over time, and configured to communicate a sensor signal representing a value of the operational status over time; an actuator that is configured to perform an action associated with the operational status of the power plant; at least one generic logic module that is configured to perform a determination of an action associated with the operational status, the determination being dependent upon processing of the sensor signal received from the sensor, and configured to communicate an actuator signal to the actuator to perform the action; and wherein the at least one generic logic module executes digital logic for the processing of the sensor signal, and wherein implementation of the digital logic excludes microprocessor based electronic hardware and excludes software.

In another aspect, the invention provides for a method for monitoring and control of a nuclear power plant, the method comprising steps of, providing a sensor configured to monitor an operational status of a power plant over time, and configured to communicate a sensor signal representing a value of the operational status over time, providing an actuator that is configured to perform an action associated with the operational status of the power plant, providing at least one generic logic module that is configured to perform a determination of an action associated with the operational status, the determination being dependent upon processing of the sensor signal received from the sensor, and configured to communicate an actuator signal to the actuator to perform the action, and wherein the at least one generic logic module executes digital logic for the processing of the sensor signal, and wherein implementation of the digital logic excludes microprocessor based electronic hardware and excludes software.

What is claimed is:

1. A plant monitoring system comprising:
a chassis comprising a backplane, the backplane configured to receive a plurality of insertable generic logic modules (GLMs); and
the plurality of GLMs, each GLM comprising:
a main circuit card insertable into the backplane and comprising:
a detachable first input mezzanine card configured to receive an input signal from a sensor that senses an attribute of the plant;
a detachable first output mezzanine card configured to selectively send an output signal to an actuator in the plant; and
a detachable logic mezzanine card comprising:
a first core field programmable gate array (CFPGA) configured to:
receive processed sensor signals from the detachable first input mezzanine card;
convert the processed sensor signals from a first format to sensor data in a second format; and
provide the sensor data to a first application specific field programmable gate array (ASFPGA); and
wherein the first ASFPGA is configured to:
receive the sensor data and, based on the sensor data and one or more criteria, direct, via the first CFPGA, the first output mezzanine card to send the output signal to the actuator.

2. The plant monitoring system of claim 1, wherein each GLM of the plurality of GLMs is configured to operate independently of each other GLM.

3. The plant monitoring system of claim 1, wherein each GLM of the plurality of GLMs is configured to operate after each other GLM has failed to operate.

4. The plant monitoring system of claim 1, wherein:
the first CFPGA of a first GLM is configured to:
signal the first output mezzanine card of the first GLM to send the output signal to a first actuator; and
the first CFPGA of a second GLM is configured to:
signal the first output mezzanine card of the second GLM to send the output signal to the first actuator.

5. The plant monitoring system of claim 1, wherein each GLM contains no microprocessor.

6. The plant monitoring system of claim 1, wherein each GLM contains no executable software.

7. The plant monitoring system of claim 1, wherein a first GLM of the plurality of GLMs further comprises:
a detachable second input mezzanine card configured to receive an input signal from a second sensor that senses a second attribute of the plant;
a detachable second output mezzanine card configured to selectively send an output signal to a second GLM of the plurality of GLMs.

8. The plant monitoring system of claim 1, wherein the attribute of the plant comprises one of a steam pressure, a temperature, a fluid pressure, a fluid flow rate, and a neutron flux over time.

9. The plant monitoring system of claim 1, wherein the detachable first input mezzanine card is configured to:
receive an analog input signal from the sensor;
convert the analog input signal into a plurality of digital signals; and
provide the plurality of digital signals as the processed sensor signals to the first CFPGA.

10. The plant monitoring system of claim 1, wherein the output signal comprises a digital output signal, and the detachable first output mezzanine card is configured to generate the digital output signal in response to the first ASFPGA.

11. The plant monitoring system of claim 1, wherein the first ASFPGA is configurable to implement a particular control function of a plurality of different control functions, and the first CFPGA is configured to support each of the plurality of different control functions.

12. A plant monitoring system comprising:
a chassis comprising a backplane, the backplane configured to receive a plurality of insertable generic logic modules (GLMs); and
a first GLM of the plurality of GLMs, comprising:
a first main circuit card insertable into the backplane and comprising:
a detachable first input mezzanine card configured to receive a first input signal from a first sensor that senses a first attribute of the plant;
a detachable first output mezzanine card configured to selectively send a first output signal to a first actuator in the plant; and
a detachable first logic mezzanine card comprising:
a first core field programmable gate array (CFPGA) configured to:
receive processed first sensor signals from the detachable first input mezzanine card;
convert the processed first sensor signals from a first format to first sensor data in a second format; and
provide the first sensor data to a first application specific field programmable gate array (ASFPGA); and
wherein the first ASFPGA is configured to:
receive the first sensor data and, based on the first sensor data and one or more criteria, direct, via the first CFPGA, the first output mezzanine card to send the first output signal to the first actuator; and
a second GLM of the plurality of GLMs, comprising:
a second main circuit card insertable into the backplane and comprising:
a detachable second input mezzanine card configured to receive a second input signal from a second sensor that senses a second attribute of the plant;
a detachable second output mezzanine card configured to selectively send a second output signal to a second actuator in the plant; and
a detachable second logic mezzanine card comprising:
a second CFPGA configured to:
receive processed second sensor signals from the detachable second input mezzanine card;
convert the processed second sensor signals from a third format to second sensor data in a fourth format; and
provide the second sensor data to a second ASFPGA; and
wherein the second ASFPGA is configured to:
receive the second sensor data and, based on the second sensor data and one or more criteria, direct, via the second CFPGA, the second output mezzanine card to send the second output signal to the second actuator.

13. The plant monitoring system of claim 12, wherein the first GLM is configured to operate independently of the second GLM.

14. The plant monitoring system of claim 12, wherein the first GLM is configured to operate after the second GLM has failed to operate.

15. The plant monitoring system of claim 12, wherein:
the first CFPGA of the first GLM is configured to:
signal the first output mezzanine card of the first GLM to send the first output signal to the first actuator; and
the second CFPGA of the second GLM is configured to:
signal the second output mezzanine card of the second GLM to send the second output signal to the first actuator.

16. The plant monitoring system of claim 12, wherein each GLM contains no microprocessor.

17. The plant monitoring system of claim 12, wherein the first GLM of the plurality of GLMs further comprises:
a detachable third input mezzanine card configured to receive an input signal from a third sensor that senses a third attribute of the plant;
a detachable fourth output mezzanine card configured to selectively send an output signal to the second GLM of the plurality of GLMs.

18. The plant monitoring system of claim 12, wherein the first attribute and the second attribute of the plant comprises one of a steam pressure, a temperature, a fluid pressure, a fluid flow rate, and a neutron flux over time.

19. The plant monitoring system of claim 12, wherein the detachable first input mezzanine card is configured to:
receive an analog input signal from the first sensor;
convert the analog input signal into a plurality of digital signals; and
provide the plurality of digital signals as the processed first sensor signals to the first CFPGA.

20. The plant monitoring system of claim 12, wherein the first output signal comprises a digital output signal, and the detachable first output mezzanine card is configured to generate the digital output signal in response to the first ASFPGA.

* * * * *